United States Patent [19]

Beyer et al.

[11] Patent Number: 5,892,832
[45] Date of Patent: Apr. 6, 1999

[54] METHOD FOR CONTROLLING THE SOUND OF AUDIO SIGNALS WITHIN A FREQUENCY RANGE

[75] Inventors: Detlev Beyer, Isenbüttel; Otto Schönemann, Wolfsburg, both of Germany

[73] Assignee: Volkswagen AG, Wolfsburg, Germany

[21] Appl. No.: 838,409

[22] Filed: Apr. 7, 1997

[30] Foreign Application Priority Data

May 18, 1996 [DE] Germany ............... 196 20 096.2

[51] Int. Cl.$^6$ ................................. H04R 25/00
[52] U.S. Cl. ................. 381/320; 381/321; 381/86; 381/98
[58] Field of Search ............. 381/68.2, 98, 102, 381/103, 104, 86, 121, 120, 312, 314, 320, 321

[56] References Cited

U.S. PATENT DOCUMENTS 4,484,345  11/1984  Stearns .
5,543,759   8/1996  Comeau, II et al. ............ 381/121

*Primary Examiner*—Vivian Chang
*Attorney, Agent, or Firm*—Baker & Botts, L.L.P.

[57] ABSTRACT

A method for sound control of audio signals within a defined frequency range in which the gain of the audio signals is varied using a control element and the filter quality factor and/or the mid-frequency of the audio signals are varied simultaneously by the same control element used to control the gain.

8 Claims, 2 Drawing Sheets

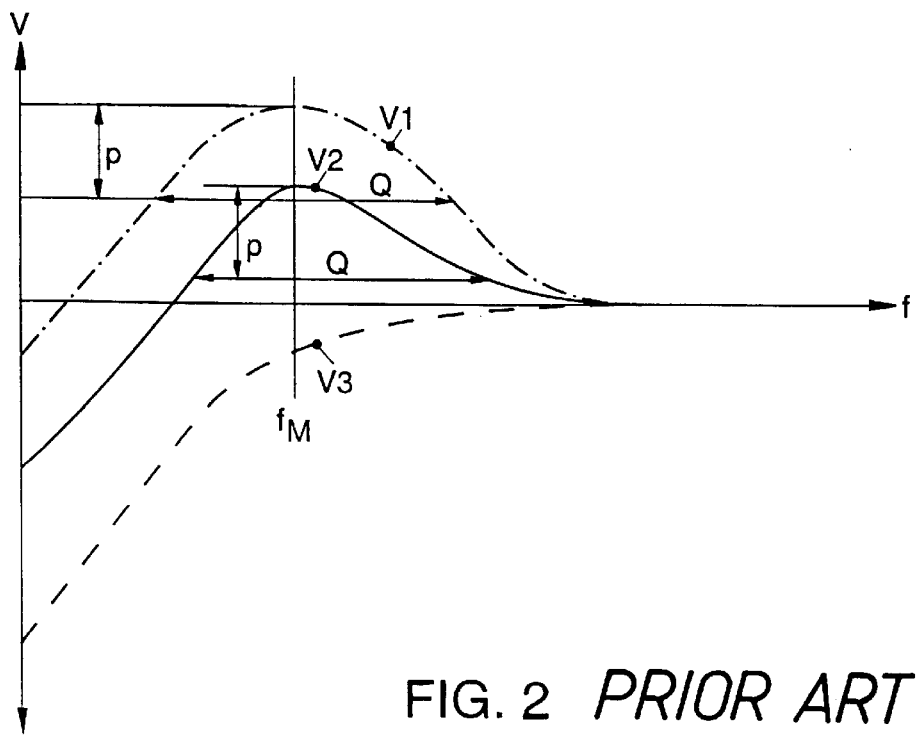
FIG. 2 *PRIOR ART*
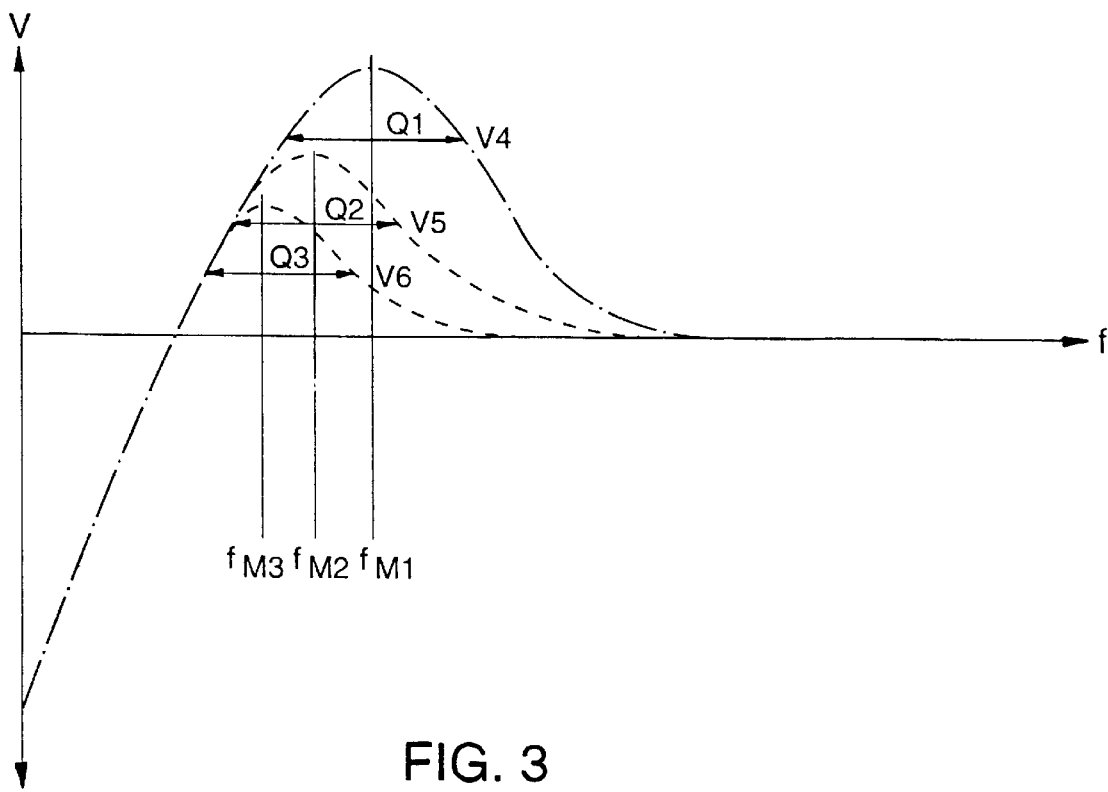
FIG. 3

METHOD FOR CONTROLLING THE SOUND OF AUDIO SIGNALS WITHIN A FREQUENCY RANGE

BACKGROUND OF THE INVENTION

This invention relates to methods for controlling the sound of audio signals within a defined frequency range in which the gain of the audio signals is varied.

In conventional audio equipment, in particular for motor vehicles, audio sound settings are carried out using a rotary knob to vary the gain of the audio signals in the bass range or the treble range. In this case, however, the mid-frequency and the filter quality factor, which characterizes the bandwidth at a specific gain level separation from the maximum gain level, are not controllable but are set in advance.

This conventional arrangement has the disadvantage that the determination of the mid-frequency value and of the filter quality factor are subject to different sensitivities by different people and what is correct for one person is, for example "too soft", "too spongy" or "too hard or too dry" for others.

SUMMARY OF THE INVENTION

Accordingly, it is an object of the invention to provide a method for controlling the sound of the audio signals within a frequency range which overcomes the disadvantages of conventional methods.

Another object of the invention is to provide a method for controlling the sound of audio signals which controls the mid-frequency value and the filter quality factor in an improved manner.

These and other objects of the invention are attained by varying the filter quality factor and/or the mid-frequency of the audio signals simultaneously as a function of the gain of the audio signals using the same control element. For this purpose, the variation of the filter quality and/or of the mid-frequency of the audio signals as a function of the gain of the audio signals is advantageously stored as a set of characteristics, preferably a gain/frequency set of characteristics. When defining the individual responses of the set of characteristics, it is assumed that a listener who sets the maximum gain prefers a "full" or "soft" sound impression, particularly in the bass range, and a listener who sets a low gain would rather have a "dry" or "hard" sound impression. Consequently, according to a preferred embodiment of the invention, the filter quality and the mid-frequency of the audio signals are increased as the gain of the audio signals is increased.

In response to variation of the gain throughout its range, the mid-frequency of the audio signals should advantageously be varied in the range from 50 to 160 Hz in the bass range, and the range of variation of the filter quality factor should be approximately between 1 and 5.

The use of a single knob adjustment for sound control is particularly advantageous when the method is used in an audio equipment in a motor vehicle since nothing is changed as far as the operator is concerned and, as a result, the distraction of the driver from the traffic conditions while driving is kept at a minimum.

BRIEF DESCRIPTION OF THE DRAWINGS

Further objects and advantages of the invention will be apparent from a reading of the following description in conjunction with the accompanying drawings, in which:

FIG. 2 is a graphical representation showing various gain/frequency responses according to the prior art; and FIG. 3 is a graphical representation showing various gain/frequency responses according to a representative embodiment of the invention.

DESCRIPTION OF PREFERRED EMBODIMENTS

Figure 1:
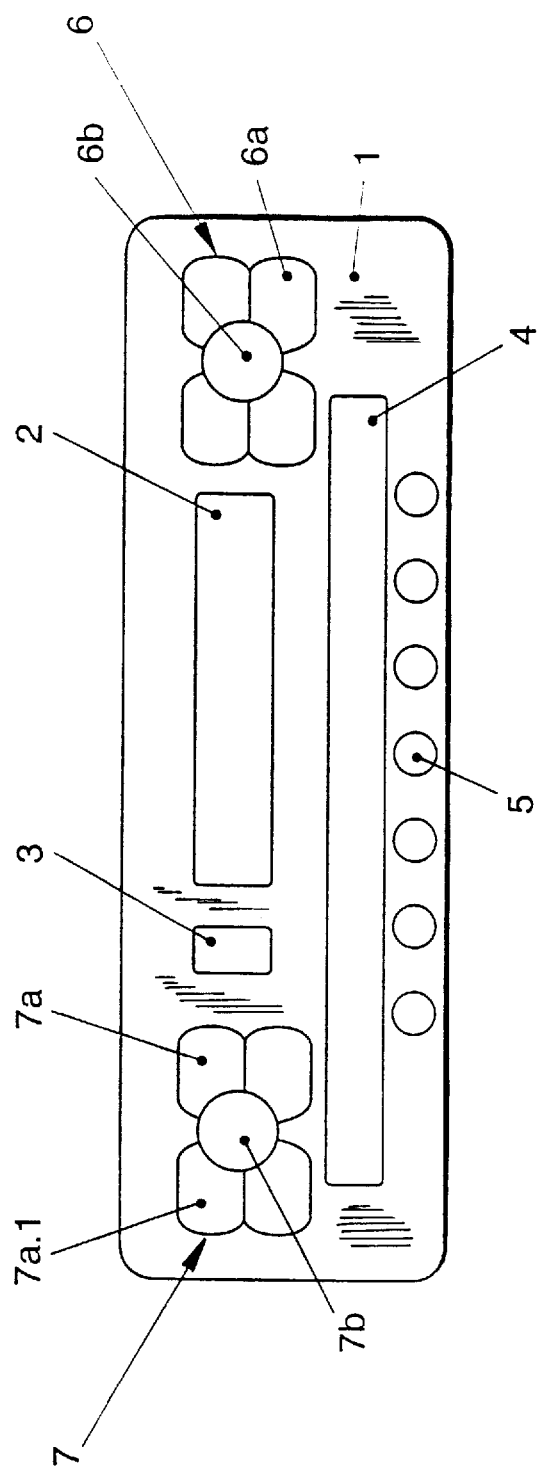
FIG. 1 is a schematic illustration showing a representative control arrangement for audio equipment.

In the typical arrangement shown in FIG. 1, audio equipment for a motor vehicle has a display device 4 for displaying, for example, the identification of a selected radio station, as well as various knob and pushbutton control elements 5, 6 and 7. Using the pushbuttons 5, it is possible to select stored radio stations and with the control elements 6 and 7, which comprise the pushbuttons 6a and 7a and rotary knobs 6b and 7b, it is possible to carry out, inter alia, a radio station selection and volume control and sound control of the audio signals. In addition to a radio section, the audio equipment 1 also includes a cassette section 2 whose mechanical functions (for example cassette ejection) are controlled by a control element 3. The other functions of the cassette section are controlled by the control elements 6 and 7 of the radio section.

For both the radio section and the cassette section a pushbutton 7a.1 is depressed for sound control in the bass range. Thereafter, the sound setting in that range can be carried out using the rotary knob 7b.

FIG. 2 shows various gain/frequency responses V1, V2, V3 for bass sound control which can be set using conventional audio equipment. From FIG. 2 it can be seen that, in conventional equipment, only the gain V is varied in principle. In all cases, the mid-frequency $f_M$ and the filter quality factor Q, which characterizes the bandwidth at a specific level separation p from the maximum level, remain constant.

According to the invention, when sound control is selected by the pushbutton 7a.1, various gain/frequency responses in the bass range V(f), which are stored in a memory (not illustrated), can be selected by the rotary knob 7b. As an example, three gain/frequency responses V4, V5 and V6 are illustrated in FIG. 3. As can be seen, these responses differ not only in their gain but also in their mid-frequency value $f_{M1}$–$f_{M3}$ and in their filter quality factor Q1–Q3. In the exemplary embodiment, as the gain V becomes larger, the mid-frequency value $f_{M1}$–$f_{M3}$ and the filter quality factor Q1–Q3 also increase.

Although the invention has been described herein with reference to a specific embodiment, many modifications and variations therein will readily occur to those skilled in the art. Accordingly, all such variations and modifications are included within the intended scope of the invention.

We claim:

1. A method for controlling the sound of audio signals within a defined frequency range comprising the steps of:

varying the gain of the audio signals by a control element; and simultaneously varying at least one of the filter quality factor and the mid-frequency of the audio signals by the same control element as a function of the variation of the gain.

2. A method according to claim 1 comprising:

varying one of the filter quality factor and the mid-frequency of the audio signals by selecting a set of stored characteristics as a function of the gain of the audio signals.

3. A method according to claim 2 wherein the set of stored characteristics is a gain/frequency set of characteristics.

4. A method according to claim 1 comprising the step of:

increasing the filter quality factor of the audio signals as the gain of the audio signals increases.

5. A method according to claim 1 comprising the step of:

increasing the mid-frequency of the audio signals as the gain of the audio signals increases.

6. A method according to claim 1 comprising:

varying the mid-frequency of the audio signals in a range from 50 to 160 Hz.

7. A method according to claim 1 comprising:

varying the filter quality factor in a range from 1 to 5.

8. A method according to claim 1 comprising:

using a sound control element in an audio equipment for a motor vehicle to vary the gain of the audio signals.

* * * * *

UNITED STATES PATENT AND TRADEMARK OFFICE
CERTIFICATE OF CORRECTION

PATENT NO. : 5,892,832

DATED : April 6, 1999

INVENTOR(S) : Beyer et al.

It is certified that error appears in the above-identified patent and that said Letters Patent is hereby corrected as shown below:

On the title page:

<u>Column 2</u>, [56] References Cited, U.S. PATENT DOCUMENTS, Insert:
-- 5,459,791 10/1995 Jostins, et al. --;

<u>Column 2</u>, Insert: -- [56] References Cited, FOREIGN PATENT DOCUMENTS

| | | |
|---|---|---|
| 3505455 | 8/1986 | Germany |
| 4427912 | 2/1996 | Germany |
| 3721626 | 1/1988 | Germany |
| 4327507 | 3/1995 | Germany --. |

Signed and Sealed this

Twenty-first Day of November, 2000

Attest:

Q. TODD DICKINSON

*Attesting Officer*  *Director of Patents and Trademarks*